United States Patent

Block

[15] 3,700,341

[45] Oct. 24, 1972

[54] LAMINATED BOARD AND METHOD OF MAKING SAME

[72] Inventor: James P. Block, Long Beach, Calif.

[73] Assignee: LCOA Laminating Company of America

[22] Filed: July 27, 1970

[21] Appl. No.: 58,230

[52] U.S. Cl. ............................408/1, 408/87, 83/658
[51] Int. Cl. .............................................B23b 35/00
[58] Field of Search .............408/87, 88, 3, 1; 83/658

[56] References Cited

UNITED STATES PATENTS 3,052,150 9/1962 Jonker......................408/88 X
3,246,544 4/1966 Cooper...........................408/3

*Primary Examiner*—Andrew R. Juhasz
*Assistant Examiner*—Z. R. Bilinsky
*Attorney*—Sokolski & Wohlgemuth

[57] ABSTRACT

A laminated board formed of a core of pressed wood covered with preferably aluminum foil outer layers, adhesively bonded thereto, which is useful for a back-up board when drilling printed circuit boards which is formed by drying the pressed fiber core to a low moisture contest prior to adhesively bonding the aluminum foil thereto.

2 Claims, 2 Drawing Figures

INVENTOR
JAMES P. BLOCK
BY
SOKOLSKI & WOHLGEMUTH
ATTORNEYS

LAMINATED BOARD AND METHOD OF MAKING SAME

In the electronics industry, the circuit boards require extensive drilling operations for leads that will pass therethrough as well as to provide apertures for attachment of boards in place. It is important to be able to drill through the circuit board without leaving a burr on the periphery of the formed hole. As a result, it is very important to use a back-up board beneath the circuit board during the drilling operations or to have burr free holes. Until the herein invention, various types of boards for printed circuit board drilling operations were utilized. The most prevalent form of back-up board is known as lofting board which is comprised of a laminative fiber glass cloth in paper cardboard impregnated with, normally, an epoxy type resin. The problem with this type of board, however, is that the heat from the drill bit is often sufficient to melt around the holes formed by the drilling operation in this board so that the board will give in that area. As a result, a burr will form on the circuit board. In other words, the heat prevents the lofting board from serving the basic function of the back-up board to prevent the burr occurring. Another type of back-up board utilized is a second grade printed circuit board. A typical circuit board has a fiberglass core with a lamination of a copper layer or foil. Even the second grade printed circuit board is relatively expensive to manufacture. Further, it generally has a maximum thickness of one-sixteenth inch and thus will tend to warp preventing it from serving its desired purpose. A ⅛-inch printed circuit board could be made. However, its expense becomes prohibitive. For back-up board purposes, it thus is apparent that the thicker board is not at all feasible. An inexpensive back-up material is plain, pressed wood, such as masonite. However, this does not serve to eliminate the burr problem. Once again, the Masonite type board is one-eighth inch and will tend to warp because it does not have good physical strength. Further this material is too flexible and will bend when under stress. In view of this, the plain pressed board or Masonite is not used extensively. The advantage of this last approach, however, is that longer drill life is achieved as compared to the first two approaches of the lofting board and printed circuit board which are very hard and tend to considerably shorten the drill life. Thus, though the major drawback of the prior art back-up boards as a group is that they will not maintain the circuit boards flat, this might be overcome by simply increasing the thickness of such prior boards but then the cost, as indicated, becomes prohibitive.

Thus, the object of this invention is to provide a new back-up board for circuit board drilling applications.

Another object of this invention is to provide a method of forming a back-up board for circuit board drilling applications.

The above objects of this invention are accomplished by utilizing as a back-up board circuit board drilling applications, a laminate structure which has a core of pressed wood fibers commonly known as Masonite. Adhesively bonded to both sides of the core is aluminum foil to provide a composite laminate structure. In order to form the laminate, the Masonite board is dried to a moisture content of less than 1.5 weight percent. A thermosetting resin adhesive is then applied between the board and aluminum foil. The composite is then subjected to sufficient pressure and temperature to form the desired end product.

It is believed that this invention will be further understood from the following detailed description and drawings.

Figure 1:
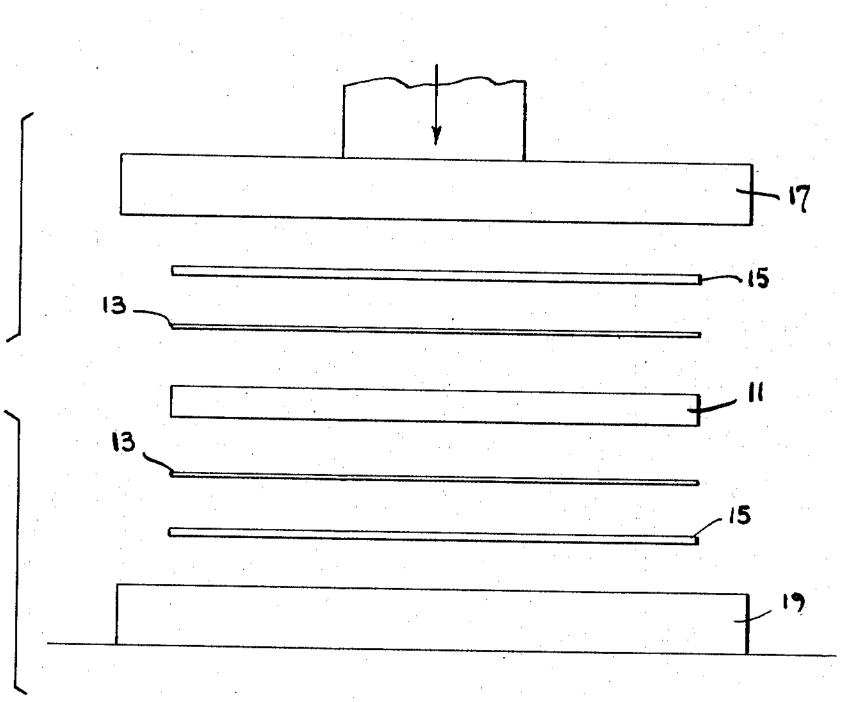
FIG. 1 is a schematic representation of the laminate layers of the invention between the press prior to forming the structure.

Foil or sheets of metal, has in the past, been adhesively bonded to fibrous materials. For example, aluminum sheets have been bonded to a core of wood. Such laminate structures have had applications as lightweight structural members. In U.S. Pat. No. 1,878,086, there is even disclosed bonding a metal foil to Masonite to form a composite laminated panel structure. As disclosed in that patent, the laminate structure could be used as a panel for automobiles and other structural type applications thus further indicating that the composite of a metal layer of foil and wood or wood fibers was considered to be for structural purposes only. As such, there was no severe requirement that the panel be absolutely flat and that there be no irregularities in the outer metal surface where sufficient bonding to the wood fibers was not achieved. In other words, some surface imperfections could obviously be tolerated in these structural applications.

In the application of the herein invention, wherein the laminate structure must be preferably flat to serve as a underlying board for drilling circuit boards, imperfections in the surface cannot be tolerated. As a result, it is important that the aluminum be bonded along the entire surface of the laminate structure and that there be no pockets of trapped gas, air and the like between the fiberboard and the aluminum. In view of this requirement, the process of this invention differs from that disclosed in the prior art in that the fiberboard core is first dried prior to the lamination procedure to an extremely low moisture content of less than 1.5 weight percent. Above 1.5 percent, the moisture will volatize off as a gas during the heating and pressure required to bond the aluminum. This will prevent a bond from occuring in the regions of the off gas, as well as create imperfections in the aluminum foil surface. It is for this reason that a material such as Masonite is important to the herein invention. Masonite is formed of pressed fibers wherein there is no adhesive bonding agent present in the board. The only moisture content in the Masonite is due to the presence of the water. This can be readily removed by heating the board to volatilize the water content and drive it off as steam prior to bonding the aluminum. Where adhesives are used to bond the wood fibers of a board it is too difficult, if not impossible, to rid the board sufficiently of its volatile content due to the solvents that are present in the adhesive mixture. Though Masonite is preferred, other pressed fibrous boards can be used providing that the volatiles contained can be readily removed prior to bonding the metal foil. Thus, as can be appreciated, the prior art did not teach nor did it necessitate such an extremely low moisture content in a fiberboard prior to the herein lamination process since imperfections in the surface could be tolerated due to escaping gas from the board.

The Masonite board typically used in the herein invention has a thickness of about one-eighth inch. The aluminum foil has a thickness of 0.002 inch, such that when both sides of the Masonite board are adhesively covered with the foil the total thickness of the composite is one-eighth inch, which is considerably thicker than most of the prior art boards utilized in the foregoing circuit boards. Though aluminum is preferred because of its lightweight and low susceptability to corrosion, virtually any other suitable metal can be utilized. If magnetic holding ability is desired, the foil can be made out of steel. Additionally, of course, material such as copper foil can be affixed to the Masonite as well as stainless steel, brass, titanium, and the like. However, aluminum is probably the best all around material from the cost, weight and practical standpoint.

Most any thermoset type resin adhesive can be utilized to bond the metal foil the the Masonite core. These include the known classes of epoxy, polyester, melamine, and phenolic type resin adhesives. The adhesive can be applied either to the sides of the Masonite to which the foil is to be bonded or can be applied even to the foil itself. Preferably the adhesive is impregnated into a thin paper carrier. This dry sheet can then be laid or rolled between the foil and the Masonite. Generally, it is preferred that the resin content of the adhesive be in the range of 45 to 60 weight percent. The volatile contents of the adhesive should preferably be in the range of 5 to 15 weight percent with 8 to 12 weight percent being preferred. It is a simple process or procedure to determine the particular resin most suitable, as well as the solids contents of the resin solution to best achieve the desired results. This is accomplished by simply atacking test pieces of aluminum foil and the Masonite board. One can then set a press at 325°F and place the laminate structure with the adhesive therebetween in the press subjecting it to a pressure of 100 psi for 5 minutes. The removed samples should then be tested. The samples should break cleanly with no effects of the lamination. In attempting to peel back the aluminum foil, the bond strength should be such the layer of Masonite is peeled off with the aluminum foil.

In order to produce the composite board of the invention, the moisture content of the received Masonite is first reduced as indicated to a moisture content of less than 1.5 weight percent. The board as received normally has a moisture content of 8 to 9 weight percent. Generally, it is found that the moisture can be removed to the desired level by placing the board in a drying oven at a temperature of about 300°F for approximately 5 minutes. Obviously at higher temperatures, the time can be reduced. Once again, it is a straightforward procedure to determine the optimum temperature and time conditions by simply weighing the board before and after heating to determine the moisture weight and this content.

Figure 2:
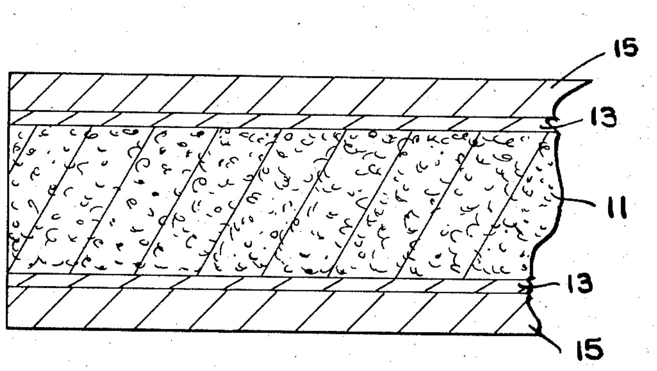
FIG. 2 is a cross sectional view of a laminate board of this invention.

After the Masonite has been dried to the desired low moisture content, the board is ready for being formed into the desired laminate. As shown in FIG. 1, the core material 11 is disposed between thin layers of paper 13 which is completely impregnated with a dry phenolic resin or other suitable adhesive resinent materials. The thickness of the impregnated paper layers 13, is quite thin, on the order of 0.005 to 0.009 inch. Aluminum foil sheets 15 are then disposed on either side of the impregnated paper layers 13 to form the outer surface of the composite. The stacked elements are then placed in a heated press having platen 17 and 19. The platens are heated to a temperature on the order of 300°F and subject the layers to an initial pressure of 100 psi. These conditions are held until the adhesive liquifies and has cured completely. With a phenolic type resin, this normally is achieved in 15 minutes. As pointed out, both sides of the Masonite core 11 are thus coated with aluminum foil sheet 15 at the same time. If one side was done and not the other, a warped condition would result which would prevent the herein composite board from serving as an underlying surface for drilling circuit boards. Due to this problem, aluminum foil sheets 15 are disposed on both sides of the circuit board 11 as shown on FIG. 2 and the resultant structure is completely warp-free. This overcomes the most severe disadvantages of the prior art type of boards. It should be pointed out that though the arrangement shown in FIG. 1 relates to a batch type fabrication process, the herein boards be obviously produced for mass production in a continuous operation. For example, the aluminum foil can be fed onto and applied against the core material with the adhesive either being rolled onto the core in the form of an impregnated layer or could be sprayed onto either the foil or the core material as it passes along the production line. The structure, then, could be bonded by pressing the materials between a series of heated rollers. The volatiles in the adhesive are removed by the action of the rollers which would force the gas out from between the board and the foil. The particular advantage of the arrangement shown in FIG. 1 is the fact that the platen can be controlled to be flat thus providing extremely even and flat surfaces on the board formed. This is more difficult to control when utilizing the rollers in a continuous type operation.

I claim:

1. A method of drilling circuit boards comprising:
providing a circuit board to be drilled,
providing a back-up board formed of a pressed wood fibrous core having metal foil laminated to both sides thereof,
placing said circuit board on said back-up board,
and drilling through said circuit board to said back-up board.

2. The method of claim 1 wherein:
said back-up board has aluminum foil bonded thereto.

* * * * *